(12) United States Patent
Casto et al.

(10) Patent No.: US 6,791,157 B1
(45) Date of Patent: Sep. 14, 2004

(54) INTEGRATED CIRCUIT PACKAGE INCORPORATING PROGRAMMABLE ELEMENTS

(75) Inventors: James John Casto, Lakeway, TX (US); Qadeer Ahmad Qureshi, Round Rock, TX (US); Hugh William Boothby, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/484,311

(22) Filed: Jan. 18, 2000

(51) Int. Cl.$^7$ ............................................. H01L 29/00
(52) U.S. Cl. ........................ 257/529; 257/209; 257/530; 257/665; 361/626; 361/630; 361/641; 361/833; 361/837
(58) Field of Search ................................ 257/529, 209, 257/530, 665; 361/104, 275.4, 626, 628, 630, 641, 833, 837

(56) References Cited

U.S. PATENT DOCUMENTS

| | | | | |
|---|---|---|---|---|
| 4,296,398 A | * | 10/1981 | McGalliard | 337/297 |
| 4,394,639 A | * | 7/1983 | McGalliard | 337/292 |
| 4,494,135 A | * | 1/1985 | Moussie | 357/59 |
| 4,626,818 A | * | 12/1986 | Hilgers | 337/166 |
| 4,768,193 A | * | 8/1988 | Takemae | 371/10 |
| 5,103,166 A | | 4/1992 | Jeon et al. | 324/158 |
| 5,134,616 A | * | 7/1992 | Barth, Jr. et al. | 371/10.3 |
| 5,266,829 A | * | 11/1993 | Hamdy et al. | 257/530 |
| 5,311,053 A | * | 5/1994 | Law et al. | 257/529 |
| 5,400,262 A | * | 3/1995 | Mohsen | 364/489 |
| 5,536,968 A | * | 7/1996 | Crafts et al. | 257/529 |
| 5,561,627 A | * | 10/1996 | Matsubara et al. | 365/185.04 |
| 5,622,892 A | * | 4/1997 | Bezama et al. | 438/601 |
| 5,708,291 A | * | 1/1998 | Bohr et al. | 257/529 |
| 5,727,208 A | | 3/1998 | Brown | 395/653 |
| 5,747,779 A | | 5/1998 | Asanasavest | 219/603 |
| 5,748,031 A | * | 5/1998 | Best | 327/525 |
| 5,764,529 A | | 6/1998 | Capps, Jr. et al. | 364/489 |
| 5,813,881 A | * | 9/1998 | Nathan et al. | 439/516 |
| 5,998,853 A | | 12/1999 | Sugasawara | 257/529 |
| 6,191,641 B1 | * | 2/2001 | Devanney | 327/525 |
| 6,218,859 B1 | * | 4/2001 | Pederson | 326/39 |
| 6,369,437 B1 | * | 4/2002 | MacPherson et al. | 257/209 |
| 6,434,632 B1 | * | 8/2002 | Hall | 710/14 |
| 6,674,163 B1 | * | 1/2004 | Andoh | 257/707 |

FOREIGN PATENT DOCUMENTS

| | | |
|---|---|---|
| DE | 19743271 C1 | 10/1998 |
| WO | WO 97/12400 | 4/1997 |

OTHER PUBLICATIONS

AMD Athlon™ Preliminary Information "Processor Data Sheet", Publication #21016, Rev: F, Issue Date Oct. 1999, p. 25.
PowerPC™ "Processor and Cache Module Hardware Specifications", MPCPCMEC/D (Motorola Order Number), Motorola, Inc., Aug. 1997, pp. 1–19.

* cited by examiner

Primary Examiner—Tom Thomas
Assistant Examiner—Eugene Lee
(74) Attorney, Agent, or Firm—Zagorin, O'Brien, Graham, LLP

(57) ABSTRACT

An integrated circuit package includes at least one one-time programmable element, such as a fuse, having a first and a second end separated by a programmable link. The first end of the one-time programmable element is coupled to a power supply voltage node in the package. The second end of the programmable element may be coupled to an external package connection (e.g., a package pin) and/or to an internal package node that connects to an input terminal of the integrated circuit die when the integrated circuit die is mounted in the package. The information programmed by the fuses may relate to speed or voltage ratings for a microprocessor.

23 Claims, 8 Drawing Sheets

" Prior Art "

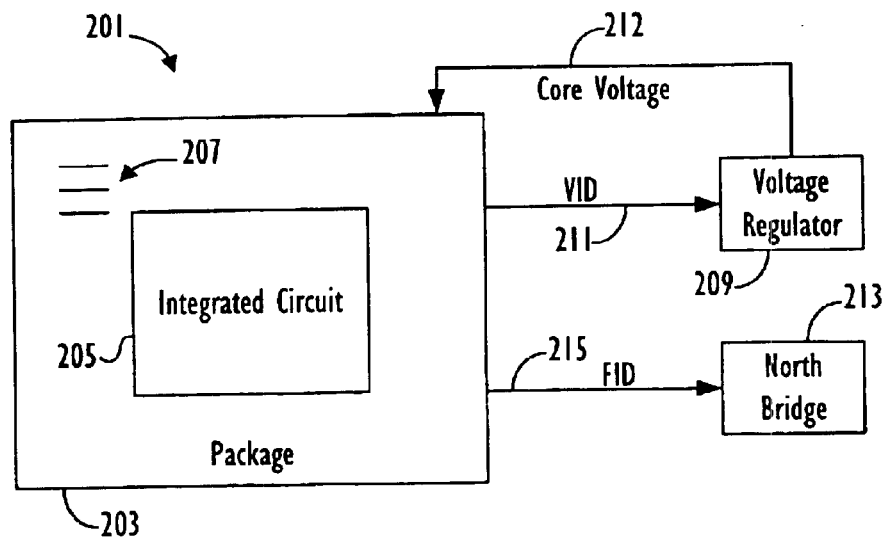
Fig. 2
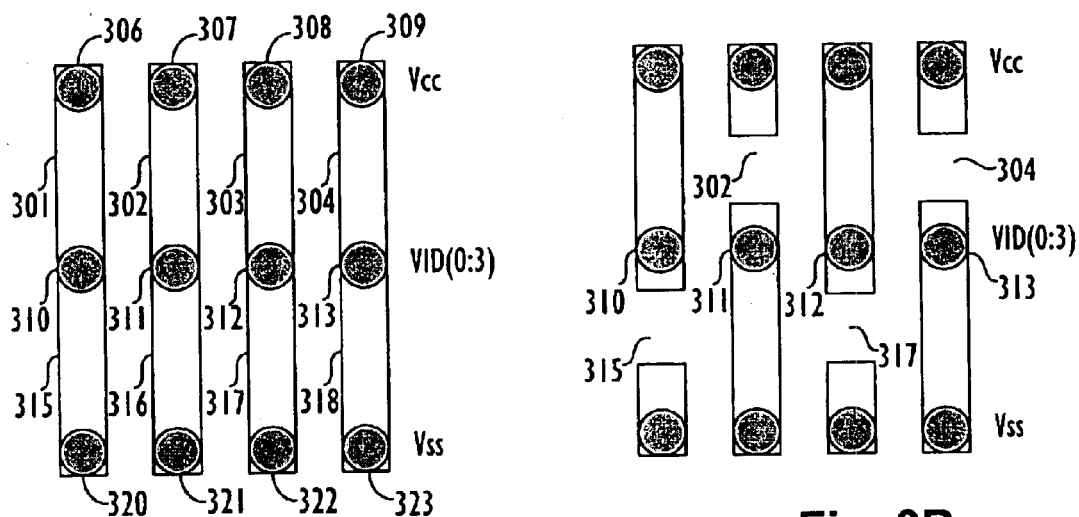
Fig. 3A
Fig. 3B
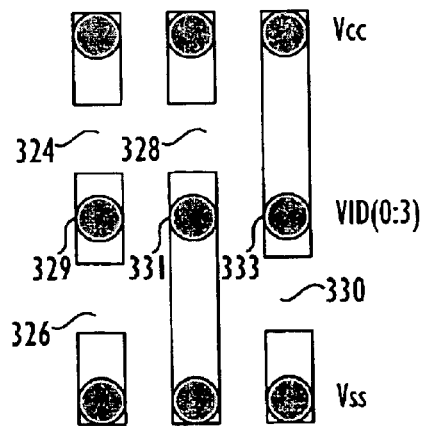
Fig. 3C

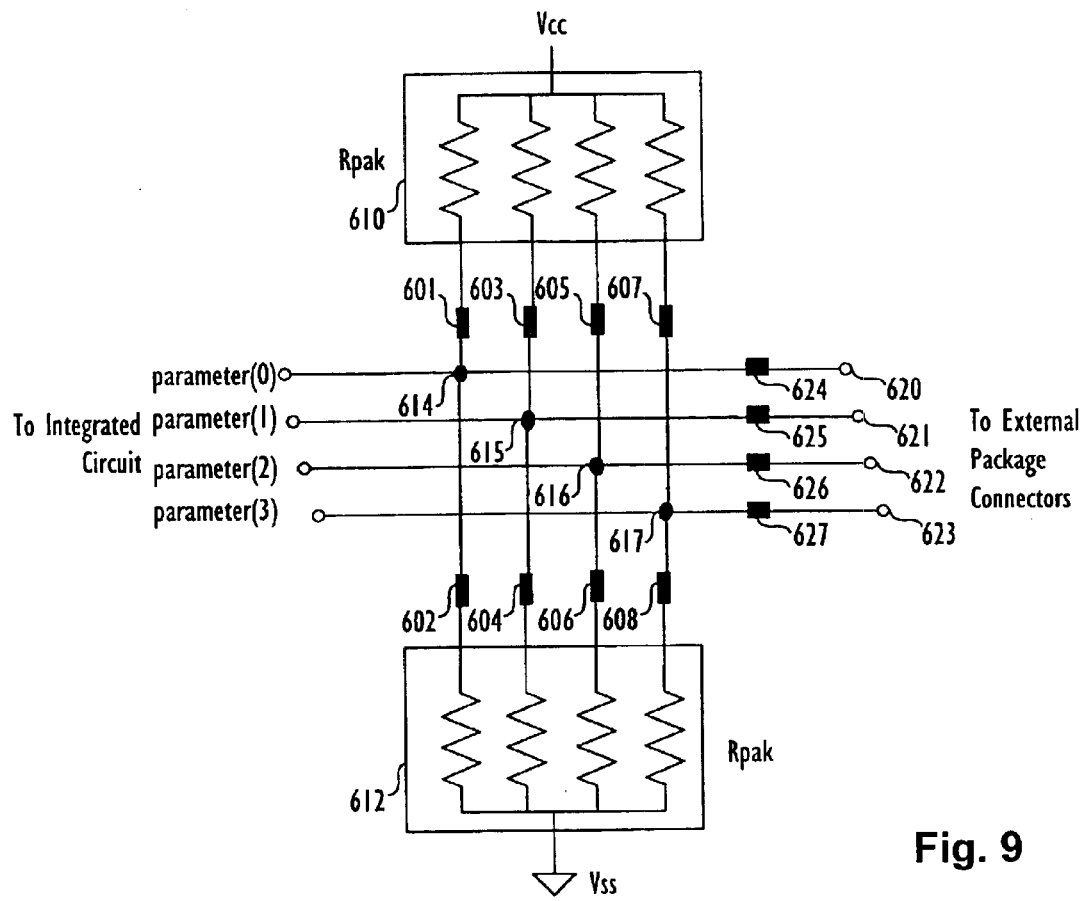
Fig. 9
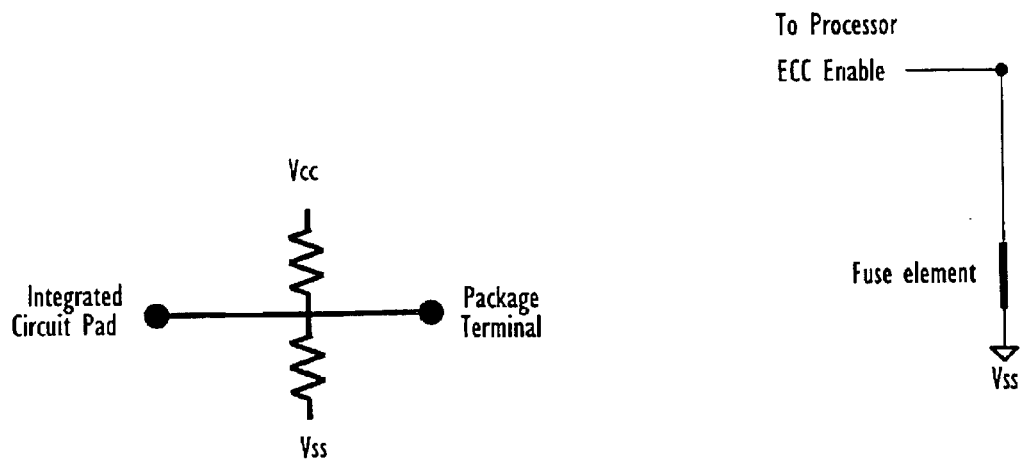
Fig. 10
Fig. 11

INTEGRATED CIRCUIT PACKAGE INCORPORATING PROGRAMMABLE ELEMENTS

BACKGROUND OF THE INVENTION

1. Field of the Invention

The invention relates to integrated circuits and more particularly to integrated circuits packaging.

2. Description of the Related Art

Integrated circuits such as microprocessors can be run at different clock speeds and with different supply voltages. The determination of what is the appropriate clock speed and appropriate voltage depends on many factors. A higher clock speed requires a higher supply voltage. In addition, the higher clock speed results in additional heat and power being dissipated. Microprocessors utilized in mobile applications are particularly sensitive to power dissipation and generally require the lowest power dissipation and thus require the lowest supply voltage that can achieve the rated clock speed. Microprocessors used in desktop applications are less sensitive to power dissipation considerations.

In general, microprocessor product yield, performance (MHz) and reliability are affected by the voltage supply setting. Within a range of only several hundred millivolts, dramatic differences can be seen in yield, performance and reliability, even from the same wafer lot. Choosing the best voltage is usually a compromise of yield, performance and reliability since the same value of voltage is usually chosen for a large population.

A higher percentage of a given population of microprocessors could operate at higher performance levels (thus creating higher revenue) if each microprocessor could operate at its own specific voltage. One solution would be to mark each processor with a number or symbol indicating its voltage and/or speed rating. However, that provides no guarantee that the appropriate voltage is supplied to the microprocessor in the final system.

Referring to FIG. 1, one prior art approach for providing the appropriate voltage and frequency values in a computer system is illustrated. Central processing unit (CPU) 101 receives bus frequency signals 103 (BF[2:0]), which provide a multiplier used by the processor to multiply a bus clock (not shown). The multiplied bus clock is used by the CPU to clock its internal logic. CPU 101 also receives core voltage 105 (commonly referred to in x86 architectures as Vcc2) from CPU core voltage regulator 107. Other voltages, which are typically supplied to the CPU, e.g., Vcc3 (I/O voltage) are not shown. Core voltage regulator 107 is programmable and receives voltage control inputs 109 (also referred to as voltage ID (VID) signals) which determine the voltage level supplied to CPU 101. The values for the both the VID signals and the BF pins are provided by the settings of jumpers 111.

It is conceivable to set the jumpers to correspond to the marking (number or symbol) on the processor that indicates its voltage and/or speed rating. However, that approach provides no guarantee that appropriate voltage and frequency settings will be utilized. In fact, certain unscrupulous suppliers of computer systems have been known to provide systems having higher than recommended voltages and frequencies. Since companies typically qualify chips at certain voltage and frequencies, such over clocking or excessive voltage can result in shorter product lifetimes, decreased reliability and excessive product returns.

Providing information to users, which specifies the correct voltage and hoping that the correct voltage is subsequently supplied to the processor by circuitry on the board, is subject both to intentional misuse and unintentional error. In addition, the more possible voltage settings that are provided, the greater the possibility for error.

An additional factor to be considered is that if information on the preferred operating voltage and frequency for a specific chip is available only after testing that chip, programming that information on the die after testing requires that additional processing steps be performed on the die. Those additional processing steps may cause increased cost.

Thus, it would be desirable to be able to specify the correct voltage for a processor and to minimize the opportunity for deliberate over clocking or over voltage and to minimize the possibility of error. Further, it would be desirable to obtain higher aggregate performance from a given population of microprocessors by specifying the proper voltage that individual processors should receive without unduly complicating the manufacturing process.

SUMMARY OF THE INVENTION

Accordingly, the invention provides in one embodiment, a package for mounting at least one integrated circuit die. The package includes at least one one-time programmable element, such as a fuse, having a first and a second end separated by a programmable link. The first end of the one-time programmable element is coupled to a power supply voltage node in the package. The second end of the programmable element may be coupled to an external package connection (e.g., a package pin) and/or to an internal package node that connects to an input terminal of the integrated circuit die when the integrated circuit die is mounted.

In another embodiment, a package for mounting at least one integrated circuit die includes at least one programmable element pair having a first and second programmable element. One end of each programmable element is coupled together through an internal package node. A second end of the first programmable element is coupled to a first internal power supply node and a second end of the second programmable element is coupled to a second internal power supply node. The internal package node may be coupled to an external package connection (e.g., a package pin) and/or to another internal package node that connects to an input terminal of the integrated circuit die when the integrated circuit die is mounted.

In still another embodiment, an electronic device includes a package having one or more programmable elements. The first end of one programmable element is coupled to a power supply node in the package. At least one integrated circuit die is mounted in the package. The second end of the programmable element may couple to an external package connection (e.g. a package pin) and/or to an internal package node that connects to an input terminal of the integrated circuit die.

Still another embodiment provides a method for setting a parameter value for an integrated circuit. The method includes selectively programming one or more programmable elements located on an integrated circuit package, to selectively couple an internal package node to a supply voltage node. The one or more programmable elements are selectively programmed according to a desired value of an integrated circuit parameter. The parameter may, e.g., be a voltage or speed rating. The internal package node is coupled to either a package pin, an input terminal of the integrated circuit or both.

In still another embodiment a method is provided that includes selectively programming at least one fuse of a fuse pair located on an integrated circuit package to selectively couple an internal node to either a first power supply voltage or a second power supply voltage. The internal node is coupled to a package pin or to an input terminal of the integrated circuit die mounted in the integrated circuit package, or to both.

BRIEF DESCRIPTION OF THE DRAWINGS

The present invention may be better understood, and its numerous objects, features, and advantages made apparent to those skilled in the art by referencing the accompanying drawings.

FIG. 2 illustrates a high level system view of one embodiment of the present invention.

FIGS. 3A–3C illustrate various fuse configurations.

FIG. 9 shows an embodiment in which the various embodiments shown in FIGS. 6–8 are combined.

FIG. 10 shows a schematic of the fuses shown in FIGS. 6–8.

FIG. 11 shows another embodiment in which a fuse provides ECC information to a processor.

The use of the same reference symbols in different drawings indicates similar or identical items.

DESCRIPTION OF THE PREFERRED EMBODIMENT(S)

Figure 1:
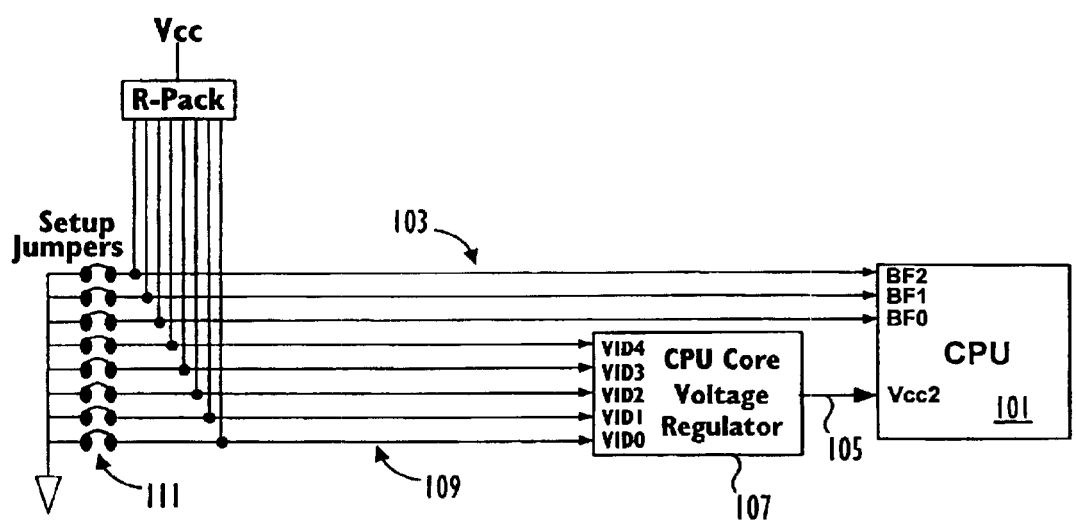
FIG. 1 shows a prior art approach for voltage and frequency settings.

Referring to FIG. 2, an overview of a system incorporating one embodiment of the present invention is illustrated. FIG. 2 show microprocessor 201 which includes package 203 that holds integrated circuit die (also commonly referred to as chip) 205. Package 203 includes fuses 207. Based on the programming of fuses 207, the package supplies voltage regulator 209 with VID signals 211. Based on the VID signals, voltage regulator 209 supplies core voltage 212 to processor 201. In addition, the package may supply system controller 213 (e.g. a north bridge including a memory controller and a PCI bridge) with frequency ID signals 215 which indicate the system clock multiplier at which the processor core operates. The fuses may also supply one or more parameters to chip 205.

Package 203 includes a number of external connections such as those providing VID) signals 211. Note that the term package as used herein is intended to include any integrated circuit carrier. The exact nature of the external connection between the package and the card to which it attaches, e.g., a motherboard or daughter card, varies according to the type of package. For example, connection between the package and the board may be through package pins such with Pin Grid Array (PGA) packages, or using other interconnection technologies such as tape automated bonding (TAB), chip scale package (CSP) technologies, or ball grid array (BGA) packages.

In addition to the external connections, the package provides connections between chip 205 and package 207. The connection between chip and package varies according to the type of package. Typical package/chip interconnection technologies include wirebonding, flip chip connections and tape automated bonding (TAB). The connections between the package and the chip and the package and the board provide for signal input/output (I/O), which convey signal information to and from the integrated circuit chip. In addition to signal I/O, the package connections provide connections for Vss and Vcc.

A wide variety of package technologies exist that can exploit the present invention. The packages are typically multi-layered packages with vias providing interconnections between the various layers. For example, package 203 may be a multi-layer fiberglass laminate made of FR4 or FR5 fiberglass, Bismaleimide Triazine (BT) Resin, or other types of organic laminate structures known in the art. The packages described herein are exemplary only and any ceramic or organic package or other package formed of other suitable material that can accommodate programmable interconnections such as fuses may used in practicing the invention.

As shown in FIG. 2, fuses specifying operating parameters such as voltage may be formed on the surface of the package. The fuses may be formed by a metalization pattern on the package surface that connect through vias to other layers of the multi-layer package and subsequently to interconnections between the chip and package, external package connections, or both. The metalization patterns may be screen printed metalization patterns.

A laser process (e.g., using a CO2, UV or a diode pumped Nd:YAG laser) may be used to program the fuses by ablating away a portion of the metalization pattern once the appropriate setting(s) for the fuse or array of fuses are known. The amount of the fuse that is ablated away may vary. For instance, the programming of the fuse may only require a cut sufficient to provide an open circuit. Alternatively, substantially all of the conductive material residing on the surface of the package may be ablated away to minimize the risk of accidental (or intentional) shorting of the fuse afterwards. By programming an array of fuses, the appropriate "data" for operating the processor (e.g., voltage or frequency control values) may be specified. The fuse area on the package can then be covered with a suitable insulating material such as epoxy or silicone to prevent later tampering or accidental damage.

FIGS. 3A–3C illustrate various programming possibilities for exemplary fuses. The fuses are formed by metal traces, or other suitable conductors, which connect to vias, indicated by dark circles at each end of the fuse. The vias shown, in general connect to package pins (i.e. external package connections), package power supply nodes (Vss or Vcc) or internal package nodes that connect to the integrated circuit die when it is mounted on the package. The particular connection depends on the type of information intended to be specified by the fuses. FIG. 3A shows the fuses prior to programming.

The fuses shown in FIG. 3A determine four bits of information. Each bit requires at least one cut. As shown in FIG. 3A, the top row of fuses 301–304 couple through vias 306–309 to Vcc. The top row of fuses also connect to vias 310–313, which in turn are coupled to package pins to provide four VID bits for connection to a voltage regulator. The bottom row of fuses 315–318 couple at one end through vias 320–323 to Vss. At the other end, the fuses couple to vias 310–313 and thus connect to one end to the top row of fuses 301–304.

Each of the fuses 301–304 and 315–318 include a fusible link coupling each end of the fuse formed by the metal trace or other suitable conductor. Referring to FIG. 3B, the programming shown provides a binary setting of 1-0-1-0 as the value of the fuses, where 1 is Vcc and 0 is Vss. That is, fuses 315 and 317 are blown causing vias 310 and 312 to be coupled only to Vcc. Fuses 302 and 304 are also blown causing vias 311 and 313 to be only coupled to Vss.

If the circuit that receives the value programmed by the fuses can differentiate an open circuit from both a high and low voltage, i.e., if the receiving circuit can utilize ternary logic, then additional voltage settings can be provided using fewer pins. For example, referring to FIG. 3C, three VID pins provide 27 separate options. FIG. 3C shows a fuse programming of 1-0-2 where 2 is Vcc, 1 is floating and 0 is Vss. That is, the fuses are blown at 324 and 326 to provide a float at node 329. Additionally, the fuses are blown at 328 and 330 to provide a 0 and 2 respectively on nodes 331 and 333.

In addition to the four package pins required in FIGS. 3A and 3B and the three package pins required in FIG. 3C, an additional package pin may be required in order to provide a special Vcc pin for testing purposes. Otherwise, the package may have its Vcc and Vss planes shorted together during package and integrated circuit testing prior to programming of the fuses.

Note that the use of the term "package pin" is used herein for convenience in describing certain embodiments. While the term is used herein to sometimes describe pins of PGA packages, the term is also used generally herein and is intended to encompass any external connection or contact between the package and the board.

Rather than provide fuse pairs to determine each VID value as illustrated in FIGS. 3A–3C, alternatively a single fuse can be used to selectively couple a package pin to a power supply voltage. For example, referring to FIG. 4A, the values for VID are provided by fuses 401–404. Each bit requires at most one cut. Fuses 401–404 couple through vias 406–409 to external package connections and provide, e.g., four VID bits for connection to a voltage regulator. The fuses also connect to vias 410–413, which in turn are coupled to Vss.

Figure 4A:
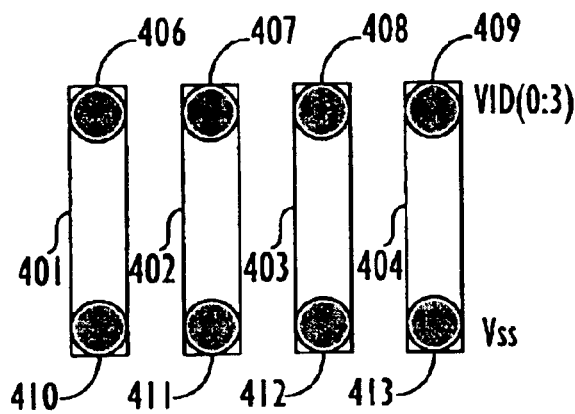
FIGS. 4A–4B show different views of another fuse configuration.
Figure 4B:
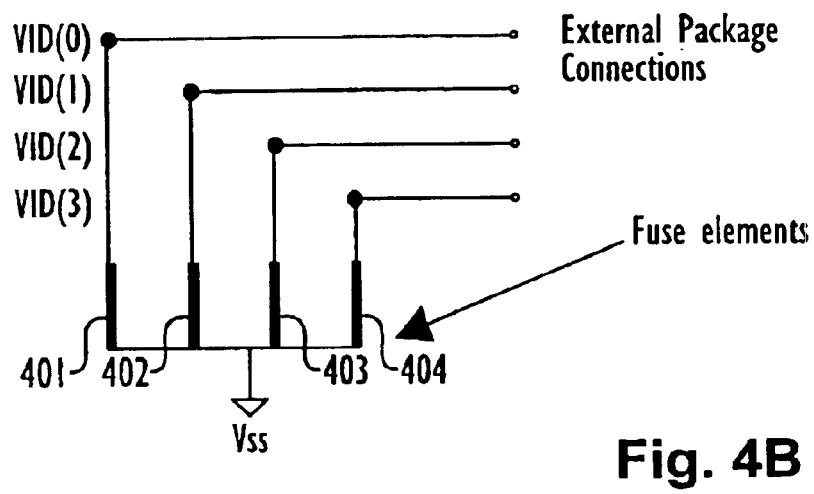
Figure 5:
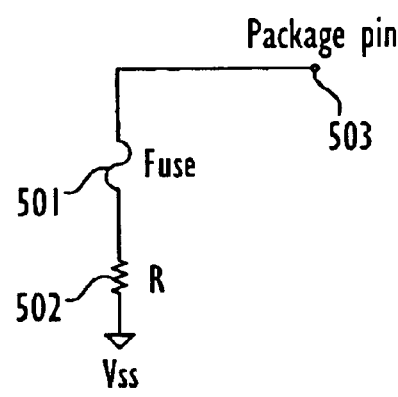
FIG. 5 shows a schematic of one of the fuses in FIG. 4A or 4B.

If fuse 401 is blown, then the package pin is not connected to Vss. An external pull-up circuit is required to set the package pin to Vcc (unless the receiving circuit can distinguish a float from a ground). FIG. 4B shows another representation of the fuses shown in FIG. 4A. Each of the fuses shown in FIGS. 4A and 4B is represented by the circuit shown in FIG. 5, which shows fuse 501 coupled to Vss through a low resistance resistor 502 (0 ohms is acceptable) and to package pin 503. The configuration shown in FIG. 4 requires a maximum of only one cut per bit of information but does require external pull-up circuits. The minimum number of cuts for four bits of information is 0 while the maximum number of cuts is four. With the four fuses shown in FIG. 3A or 4A, up to sixteen different voltage ID values may be specified. Cut here refers to blowing the fuse, typically using a laser, although other method are possible as described further herein.

While the power supply voltage on the package shown in the embodiment in FIGS. 4A and 4B is Vss, it is of course possible to instead provide a one-time programmable connection to Vcc on the package and have an external pull down circuit.

Other parameters may also be specified rather than voltage. For example, as described with relation to FIG. 2, frequency ID information may also be specified.

Figure 6:
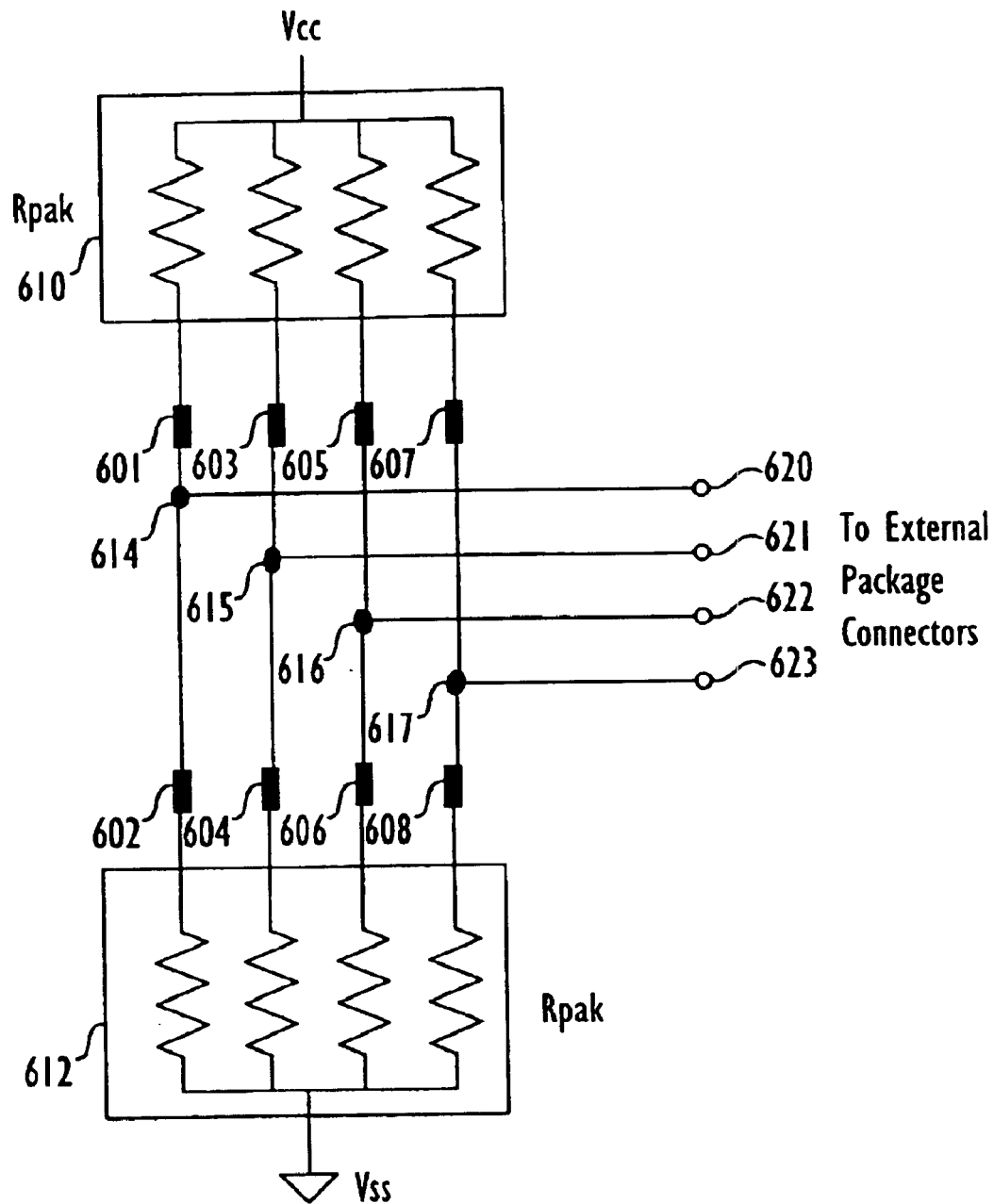
FIG. 6 shows another fuse configuration for providing information to package terminals.

Referring to FIG. 6, another fuse configuration is illustrated which provides four bits of information. The fuses are again configured in pairs (e.g., fuses 601 and 602) in a manner similar to FIGS. 3A–3C. The top fuses 601, 603, 605 and 607 of each pair couple to Vcc through resistors in resistor pack 610. The bottom fuse of each fuse pair, fuses 602, 604, 606 and 608, couple to Vss through resistors in resistor pack 612. The resistors provide a voltage divider function and thus, an extra test pin (to avoid having Vss shorted to Vcc during testing prior to programming of the fuses) may not be necessary. In the embodiment shown in FIG. 6, each of the fuse pairs couple respectively to common nodes 614–617. The common nodes 614–617 couple to external package-connections, e,g., package pins. In other embodiment, the common nodes may couple only to external package connections (package pins) or only to the chip and not utilize package pins.

Figure 7:
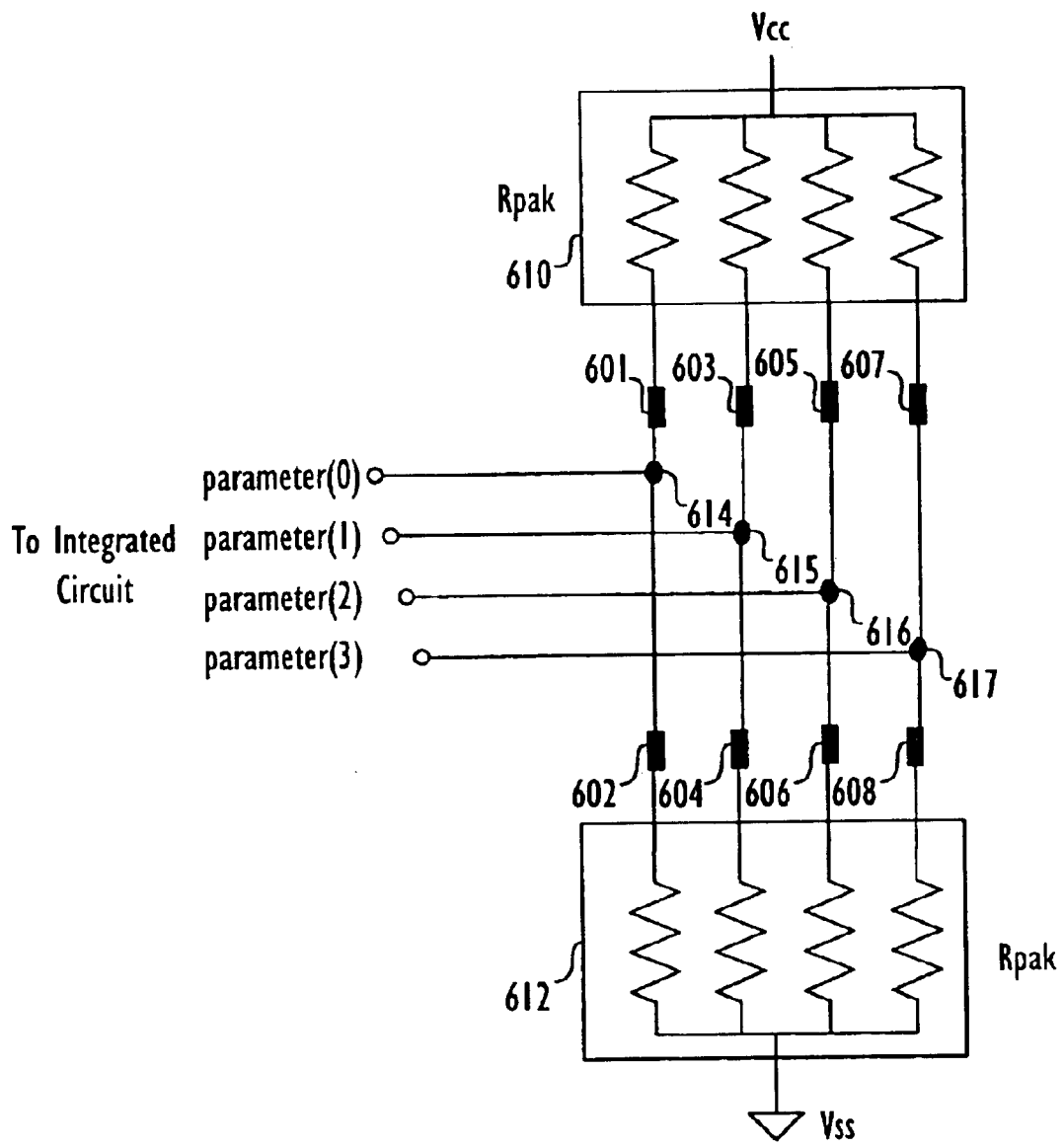
FIG. 7 shows another fuse configuration for providing information to input terminals of the integrated circuit die.

FIG. 7 illustrates an embodiment in which the value specified by the fuse array is provided to the integrated circuit instead of going to the package pins. Internal nodes 614–617 couple to, e.g., C4 pads coupling the die to the package. The fuse array may be specifying a voltage, frequency or other parameter to the integrated circuit die.

Figure 8:
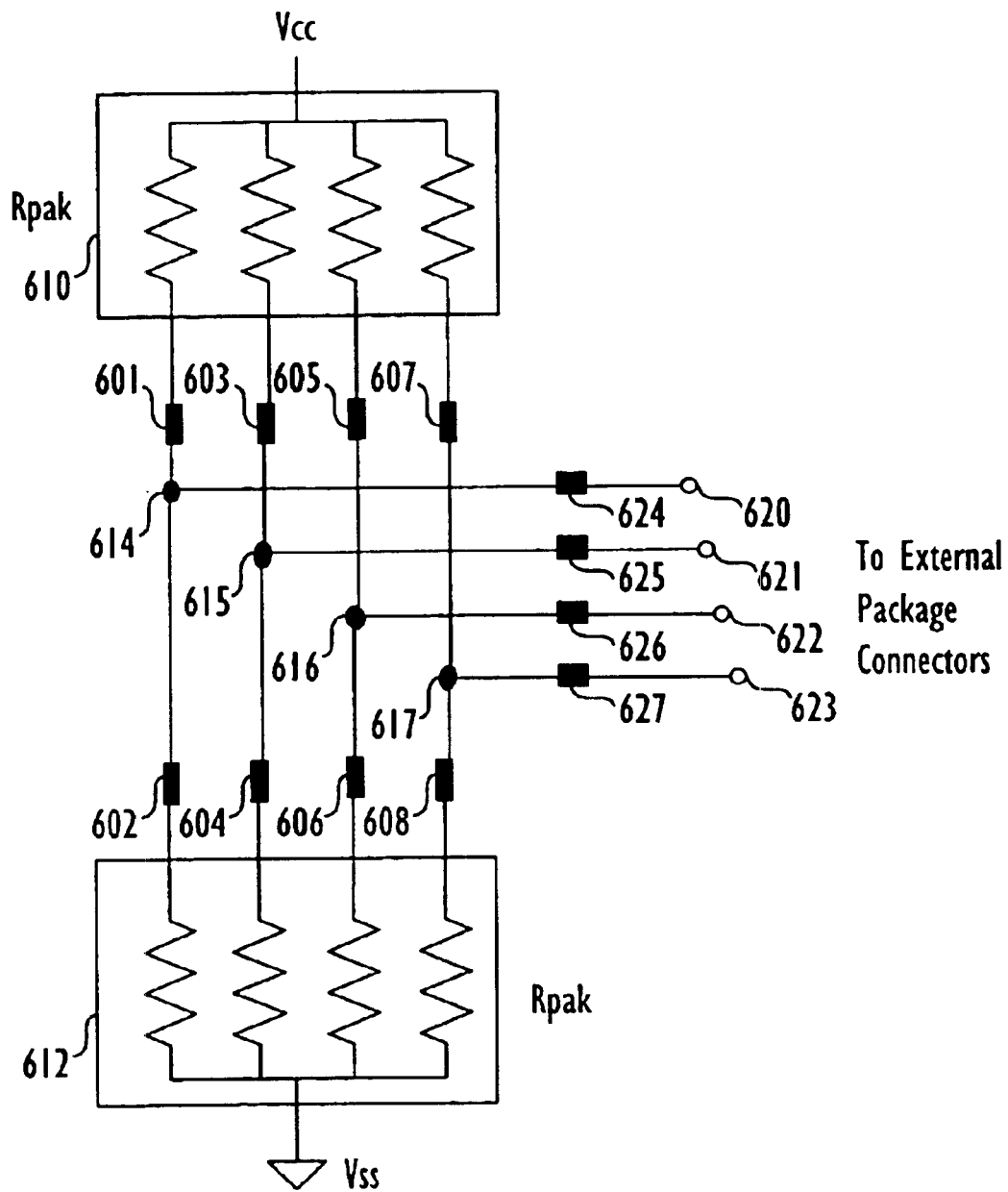
FIG. 8 shows an embodiment in which fuses are placed in series with the package I/O terminals.

FIG. 8 illustrates an embodiment in which false elements 624–627 are coupled serially between common nodes 614–617 and external package pins 620–623. The fuses 624–627 can be used in testing environments, where for example, an internal signal must be accessible during test but is then decoupled from the package pin by blowing the fuse prior to product shipment. FIG. 9 illustrates an embodiment combining the various embodiments illustrated in FIGS. 6–8. A schematic of one of the fuse pairs in FIG. 6–9 is shown in FIG. 10.

In order to program the fuse configuration shown in FIGS. 6–10, at least one fuse of each pair must be blown to connect the common node to either Vcc or Vss. Thus, for four bits of information, four cuts are generally required. If three state logic is available then both fuses of a pair can be cut to represent a third value.

Referring to FIG. 11 another embodiment illustrates a fuse, without the voltage divider configuration used in FIGS. 6–10, providing a parameter value to the integrated circuit die mounted on the package. In the particular embodiment, a signal is provided that selectively enables error correcting code (ECC) according to the state of the fuse. The ECC signal may be used, e.g., for an on-board cache for a microprocessor. An internal pull-up is required in the processor to specify a value if the fuse is not cut.

The description so far has described cutting fuses with lasers. Several alternative embodiments are also possible. For instance, while the fuses have been described as being laser programmable, the fusible links may also be programmed electrically in a manner known in the art. That is the fuses may be fabricated as electrically programmable fuses. Further, while the fuses have been described as being on the surface of the package, the fuses may actually be fabricated on internal layers of a multi-layer package and be fabricated out of a conductive material other than metal. If fuses are on a layer other than the surface of the package, then electrically programmable fuses may be preferred.

Further, while the embodiments so far have been described using fuses to provide one-time programmable interconnections to supply voltages and to external and internal package connections, antifuses may also be used. A fuse provides a normally short that turns into an open circuit when fused, using either electrical or laser programming. An antifuse is another type of one-time programmable interconnect that is equally applicable in the context of the present invention. An antifuse provides a normally open circuit that is short circuited when fused. Thus, both the fuse and antifuse are structures having two ends connected by a programmable link that, on application of suitable laser or electrical programming results in either an open or short circuit, respectively.

Wherever embodiments have been described herein as using fuses, such as in FIGS. 2–11, other embodiments utilizing antifuses are also contemplated. In that case, programming is typically opposite of the fuse embodiments as is readily apparent to those of skill in the art. One advantage of using antifuses in the context of the present invention is that the extra Vcc pin that may be required in, e.g., FIGS. 3A–3C to avoid Vcc being shorted to Vss during test, may be eliminated.

Figure 12:
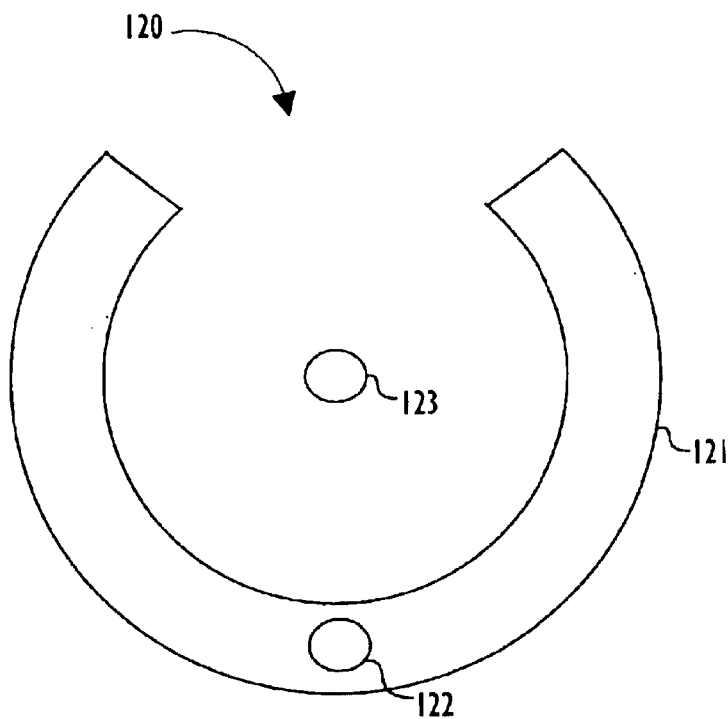
FIG. 12 shows one embodiment of an antifuse structure.

In one embodiment, an antifuse such as the one illustrated in FIG. 12 may be utilized. The antifuse 120 includes a generally circular conductive area 121 which is in electrical contact via 122. Via 122 may couple, e.g., to a power supply node. Via 123 is not in electrical contact with via 122. If it is desired to short via 122 and 123 together, then conductive paste or solder may be deposited so as to form an electrical contact between via 123 and via 122 and circular conductive area 121. The conductive paste may then be subject to ultraviolet curing.

Figure 13:
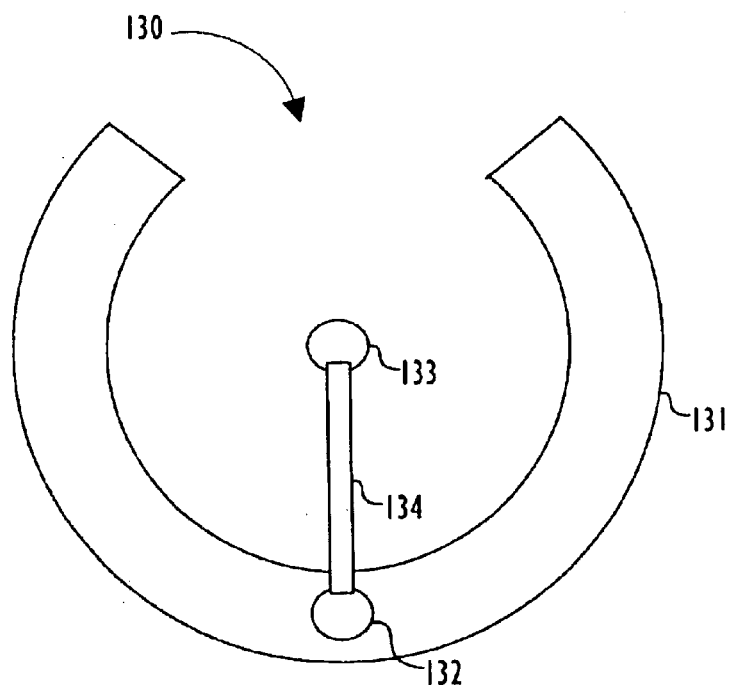
FIG. 13 shows an antifuse in parallel with a fuse.

In another embodiment, an antifuse is combined in parallel with a fuse to provide the capability of reversing a fuse cut. Referring to FIG. 13, antifuse 130 including circular conductive area 131 in electrical contact with via 132. In this embodiment, via 132 is electrically connected to via 133 via fuse 134. If fuse 134 is blown, that can be reversed at a later time by programming antifuse 130, i.e. shorting vias 133 and 132 using solder as described above. Other antifuse approaches may also be used.

While the embodiments have been generally described with relation to a package containing a single integrated circuit and particularly a microprocessor, multi-chip modules may advantageously exploit one or more of the various embodiments described herein. In addition, the invention is not restricted to microprocessors. Other types of integrated circuits may also utilize one or more of the various embodiments described herein.

One advantage of the present invention is the that testing procedures to characterize the part may be completed prior to programming of the fuses. Thus, the part in question may complete tests on automatic test equipment (ATE) as well as system level tests. Once the tests are completed and the part is characterized in terms of voltage and speed, the package may be programmed without having to perform any further processing steps on the die or any further testing, except to check that the fuses were appropriately programmed. Of course, the fuses may be programmed prior to mounting the die if the values for the fuses are known.

Because each part may have its optimum voltage and/or other parameters specified, voltage parameters may be specified with more granularity. Thus, higher aggregate performance from a given population of microprocessors may be achieved by specifying the proper voltage that individual processors should receive. That is, the same value for voltage no longer has to be chosen for as large a population of microprocessors. Of course, the system in which the packaged part is utilized must be able to exploit any signals specified by the fuses and provided to the system.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A package for mounting at least one integrated circuit die, the package comprising at least one one-time programmable element having a first and a second end separated by a programmable link, wherein the first end of the one-time programmable element is coupled to a power supply voltage node in the package and wherein the programmable element is one of a fuse and an antifuse; and wherein the package includes at least one pair of programmable elements, the one pair including the one one-time programmable element and a second one-time programmable element, the second one-time programmable element having a first and second end, the first end of the second one-time programmable element coupled to a second power supply voltage node and the second end of the second one-time programmable element being coupled through an internal package node to the second end of the first one time programmable element.

2. The package as recited in claim 1 wherein the package is a multi-layered package and the programmable element is formed of a metalization pattern located on a surface of the package.

3. The package as recited in claim 2 wherein the package is a multi-layered package and the programmable element is located on a layer other than the surface of the package.

4. The package as recited in claim 1 wherein the programmable element is covered by a protective layer.

5. The package as recited in claim 1 wherein the programmable element is not covered by a protective layer.

6. The package as recited in claim 1 wherein the second end of the programmable element is coupled to at least one of an external package connection and a package contact that connects to an input terminal of the integrated circuit die, after mounting of the integrated circuit die.

7. The package as recited in claim 1 wherein the programmable element is coupled to the power supply terminal through a resistive element.

8. The package as recited in claim 1 wherein the second end of the programmable element is coupled to an external package connection and to an internal package node that couples to an input terminal of the integrated circuit die when the integrated circuit die is mounted.

9. The package as recited in claim 1 wherein the programmable element is programmable using a laser.

10. The package as recited in claim 1 wherein the programmable element is programmable using an electrical current.

11. The package as recited in claim 1 wherein the internal package node is coupled to at least one of an external package connection and an input terminal of the integrated circuit die, after mounting of the integrated circuit die.

12. The package as recited in claim 1 further comprising a first resistive element coupled between the internal package node and the power supply node and a second resistive element coupled between the internal package node and the second power supply node.

13. A package for mounting at least one integrated circuit die, the package comprising at least one one-time programmable element having a first and a second end separated by a programmable link, wherein the first end of the one-time programmable element is coupled to a power supply voltage node in the package and wherein the package further comprises another programmable element serially coupled between the second end of the programmable element and an external package connection.

14. An electronic device comprising:
   a package including one or more one-time programmable elements having a first and a second end separated by a programmable link, wherein the first end of the one one-time programmable element is coupled to a power supply voltage node in the package and a second end of the programmable link is coupled to an internal package node;
   at least one integrated circuit die mounted in the package; and
   wherein the one one-time programmable element is part of a one-time programmable element pair, the programmable element pair including a second one-time programmable element in addition to the one one-time programmable element,
   the second programmable element having a first end coupled to the internal package node and a second end coupled to a second power supply voltage.

15. The electronic device as recited in claim 14 wherein the one or more programmable elements specify one or more operating parameter relating to the electronic device.

16. The electronic device as recited in claim 15 wherein the integrated circuit die includes a processor and the one or more operating parameters specify an operating voltage of at least a portion of the processor.

17. The electronic device as recited in claim 14 wherein the internal package node is coupled to at least one of an external package connection and the integrated circuit die.

18. The electronic device as recited in claim 14 wherein the package is a multilayered package and the programmable element is located on a surface of the package.

19. The electronic device as recited in claim 14 wherein the package is a multi-layered package and the programmable element is located on a layer other than the surface of the package.

20. The electronic device as recited in claim 14 wherein the one or more programmable elements, when programmed, specify a control value relating to clock frequency at which the processor operates.

21. The electronic device as recited in claim 14 further comprising a first resistive element coupled respectively between the internal package node and the first power supply node and a second resistive element coupled between the internal package node and the second power supply node, thereby providing a voltage divider when the first power supply node is electrically coupled to the second power supply node through the programmable element pair.

22. An electronic device comprising:
   a package including one or more one-time programmable elements having a first and a second end separated by a programmable link, wherein the first end of the one one-time programmable element is coupled to a power supply voltage node in the package and a second end of the programmable link is coupled to an internal package node;
   at least one integrated circuit die mounted in the package; and
   wherein the internal package node couples to an external package connection through another one-time programmable element.

23. An electronic device comprising:
   a package including one or more one-time programmable elements having a first and a second end separated by a programmable link, wherein the first end of the one one-time programmable element is coupled to a power supply voltage node in the package and a second end of the programmable link is coupled to an internal package node; and
   at least one integrated circuit die mounted in the package and wherein a state of the programmable element specifies use of error correction code (ECC) for a cache memory on the integrated circuit.

* * * * *

UNITED STATES PATENT AND TRADEMARK OFFICE
CERTIFICATE OF CORRECTION

PATENT NO. : 6,791,157 B1
DATED : September 14, 2004
INVENTOR(S) : James John Casto et al.

It is certified that error appears in the above-identified patent and that said Letters Patent is hereby corrected as shown below:

<u>Column 8,</u>
Line 30, the words "first one time" should read -- first -one-time --.
Line 36, the words "claim 2" should read -- claim 1 --.

<u>Column 9,</u>
Line 33, the word "parameter" should read -- parameters --.

Signed and Sealed this

First Day of February, 2005

JON W. DUDAS
*Director of the United States Patent and Trademark Office*